United States Patent [19]

Jeong

[11] Patent Number: 5,661,317

[45] Date of Patent: Aug. 26, 1997

[54] SOLID STATE IMAGE SENSOR

[75] Inventor: Jae-Hong Jeong, Seoul, Rep. of Korea

[73] Assignee: LG Semicon Co., Ltd., Chungcheongbuk-do, Rep. of Korea

[21] Appl. No.: 507,205

[22] Filed: Jul. 26, 1995

[30] Foreign Application Priority Data

Jun. 22, 1995 [KR] Rep. of Korea ............... 16930/1995

[51] Int. Cl.$^6$ ..................... H01L 27/148; H01L 29/768
[52] U.S. Cl. ..................... 257/225; 257/226; 257/232; 257/257; 257/259
[58] Field of Search ..................... 257/225, 226, 257/232, 234, 257, 259, 290, 291, 294; 437/53

[56] References Cited

U.S. PATENT DOCUMENTS 5,210,433  5/1993  Oshawa et al. .................. 257/258
5,506,429  4/1996  Tanaka et al. .................. 257/233

Primary Examiner—Wael Fahmy
Assistant Examiner—Fetsum Abraham
Attorney, Agent, or Firm—Birch, Stewart, Kolasch & Birch, LLP

[57] ABSTRACT

Solid state image sensor which can improve photic sensitivity of photodiodes by providing only one transmission line between the photodiodes, leading to reduction of width of the transmission line passing between the photodiodes, including a substrate, photodiodes formed on the substrate, a first to a fourth transmission gates arranged in sequence by four for every two photodiodes on a part of the substrate on one side of each of the photodiode, a first, and a second transmission lines arranged one by one alternatively extended at length on the substrate between adjacent photodiodes connected to the first, and the second transmission gates respectively for applying a first, and a second driving clock signals, respectively, a first contact formed at the third transmission gate, a second contact formed at the fourth transmission gate, and a third, and a fourth transmission lines formed over the transmission gates in parallel at length connected through the third, and the fourth transmission gates and the first, and second contacts respectively for applying a third, and a fourth driving clock signals, respectively.

20 Claims, 8 Drawing Sheets

SOLID STATE IMAGE SENSOR

BACKGROUND OF THE INVENTION

This invention relates to a solid state image sensor, more particularly to a solid state image sensor which can improve photic sensitivity of photodiodes by providing only one transmission line between the photodiodes.

As manufacture of high density solid state image sensor advances, there has been significant increase of resistance of the sensor because of the greater area of the chip, and the longer and wider transmission lines. In case where a driving clock signal is transmitted to a transmission gate through a transmission line in the solid state image sensor having high resistance, since the driving clock signal can not be transmitted to the transmission gate fully due to RC delay of the transmission line, perfect shift of signal charge could not have been done. Due to this, the solid state image sensor has had problems that it outputs signals distorted depending on the position.

FIG. 1 shows a plane view of a conventional solid state image sensor, and FIG. 2 is a sectional illustration of a unit cell of the solid state image sensor of FIG. 1.

Referring to FIG. 1, the conventional solid state image sensor is a device driven in 4-phase driving method wherein two tiers of transmission lines are provided between adjacent photodiodes 16-1 and 16-2 to provide four transmission lines to every two photodiodes 16 for transmission of four driving clock signals thereto at a time. That is, of the two photodiodes, with one photodiode 16-1 being assigned a first transmission gate 19-1 for applying a first clock signal thereto and a second transmission gate 19-2 for applying a second clock signal thereto, and with the other photodiode 16-2 being assigned of a third transmission gate 19-3 for applying a third clock signal thereto and a fourth transmission gate 19-4 for applying a second clock signal thereto. The first transmission gate 19-1, the second transmission gate 19-2, the third transmission gate 19-3, and the fourth transmission gate 19-4 are connected to a first transmission line 20-1, a second transmission line 20-2, a third transmission line 20-3, and a fourth transmission line 20-4, respectively.

A plurality of additional transmission lines 21, lengthy extensions over the transmission gates 19 forming a two tiered structure with light shielding films 22, are connected to the transmission gates through contacts 23, and are connected to the light shielding films 22 through the contacts 24. The plurality of additional transmission lines 21, provided on the wide transmission gates for preventing distortion of signals by the RC delay of the transmission lines, are formed of a low resistance conduction material. That is, of the plurality of additional transmission lines 21, a first additional transmission line 21-1 is connected to the first transmission gate 20-1 for applying the first driving clock signal øIM1 to the first transmission gate 20-1, a second additional transmission line 21-2 is connected to the second transmission gate 20-2 for applying the second driving clock signal øIM2 to the second transmission gate 20-2, a third additional transmission line 21-3 is connected to the third transmission gate 20-3 for applying the third driving clock signal øIM3 to the third transmission gate 20-3, and a fourth additional transmission lines 214 is connected to the fourth transmission gate 20-4 for applying the fourth driving clock signal øIM4 to the fourth transmission gate 20-4.

In the meantime, as shown in FIG. 2, the unit cell of the solid state image sensor includes a first p-type well 12 formed on a substrate 11, a second p type well 13 formed in the first p-type well 12, an n-type photodiode 16 and an n-type BCCD (Buried Charge Coupled Device) 14 formed in the first, and second p type wells 12 and 13 respectively, and a $p^{++}$ type surface isolation layer 17 formed on the n type photodiode 16. And, an additional transmission line 21 is connected to a light shielding film 22 through a contact 24. The reference number 15 represents a $p^+$ type channel stop region for isolating cells, and reference numbers 18 and 25 represent a gate insulation film and an interlayer insulation film, respectively.

The solid state image sensor has a transmission gate 19 and a transmission line 20 formed by appropriate patterning of a first polycrystalline silicon film and a second polycrystalline silicon film between the photodiodes, and an additional transmission line 21 formed by appropriate patterning of a third polycrystalline silicon film on an electrode. In this time, the transmission line, the transmission gate and the light shielding film are formed to be insulated by the insulation film 25.

The conventional solid state image sensor could have eliminated the RC delay by reducing resistance of the transmission line with the additional transmission line formed on the wide electrode. However, since the driving clock signal transmission lines are formed in two tiers between two adjacent photodiodes, the underside transmission line is wider than the upperside transmission line. Accordingly, this increase of width of the transmission line between the two adjacent photodiodes decreases areas of photodiode regions provided for sensing lights, with decrease of a fill factor. According to this, the conventional solid state image sensor has a problem of degradation of the photic sensitivity, which becomes more serious as the device becomes denser.

SUMMARY OF THE INVENTION

The object of this invention for solving the foregoing problem is to provide a solid state image sensor which can improve photic sensitivity by providing a single transmission line between adjacent photodiodes.

These and other objects and features of this invention can be achieved by providing a solid state image sensor, including a substrate, photodiodes formed on the substrate, a first to a fourth transmission gates arranged in sequence by four for every two photodiodes on a part of the substrate on one side of each of the photodiode, a first, and a second transmission lines arranged one by one alternatively extended at length on the substrate between adjacent photodiodes connected to the first, and the second transmission gates respectively for applying a first, and a second driving clock signals, respectively, a first contact formed at the third transmission gate, a second contact formed at the fourth transmission gate, and a third, and a fourth transmission lines formed over the transmission gates in parallel at length connected through the third, and the fourth transmission gates and the first, and second contacts respectively for applying a third, and a fourth driving clock signals, respectively.

BRIEF DESCRIPTION OF THE DRAWINGS

FIGS. 3A and 3B show plane views of a first embodiment solid state image sensor in accordance with this invention, wherein, FIG. 3A is a plane view before a light shielding film is formed, and FIG. 3B is a plane view after the light shielding film is formed.

FIGS. 4A to 4E are sectional illustrations across lines 3A–3A', 3B–3B', 3C–3C', 3D–3D', and 3E–3E', of FIG. 3A, FIGS. 5A and 5B show plane views of a second embodiment solid state image sensor in accordance with this invention, wherein.

DETAILED DESCRIPTION OF THE INVENTION

Embodiments of this invention is to be explained hereinafter, referring to the attached drawings.

Figure 3A:
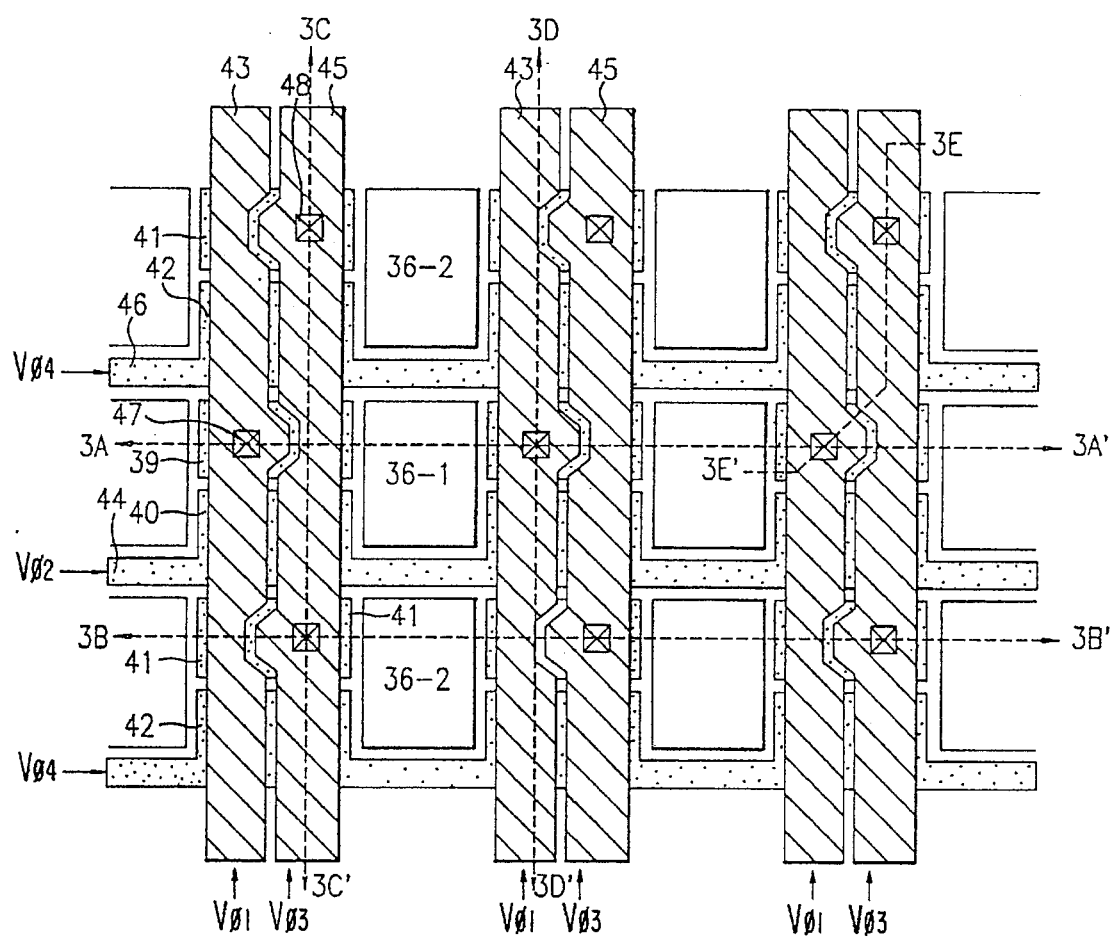
Figure 3B:
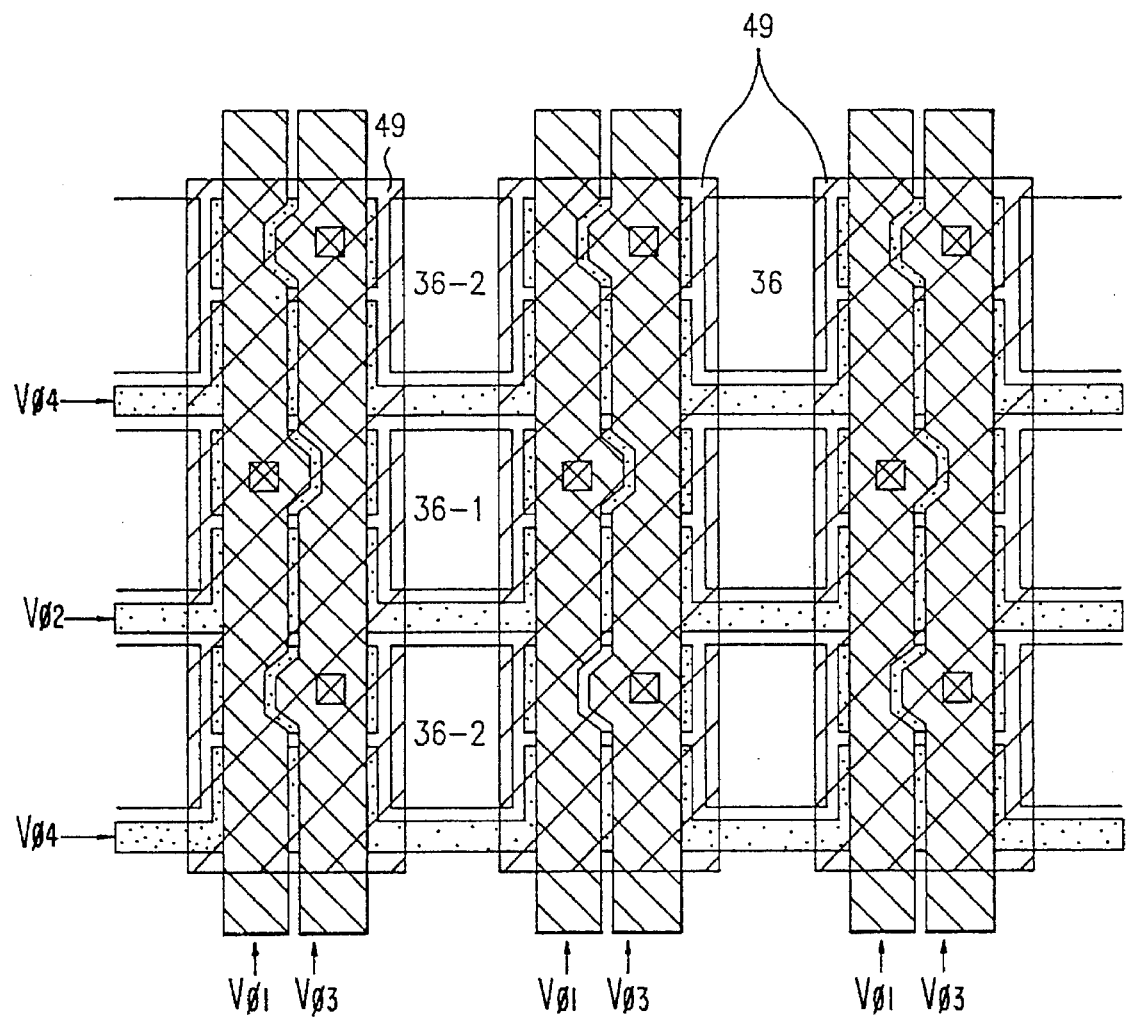
Figure 4A:
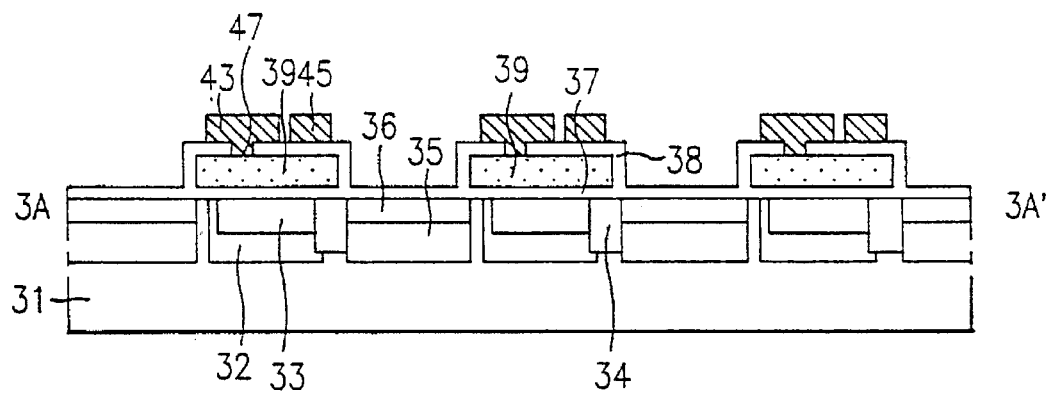
Figure 4B:
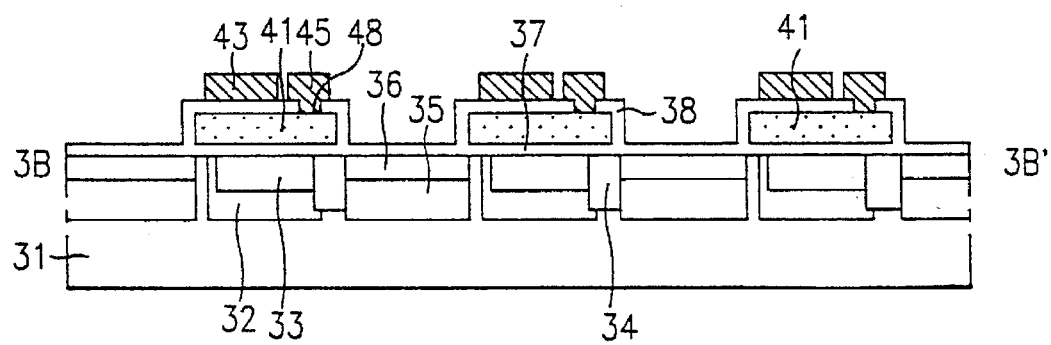
Figure 4C:
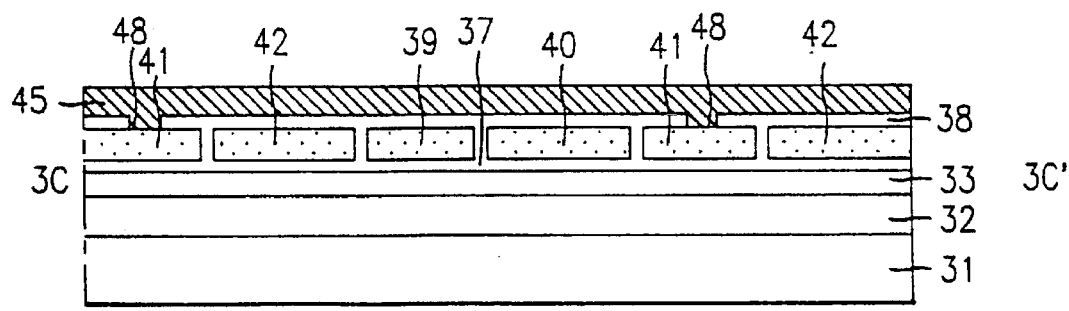
Figure 4D:
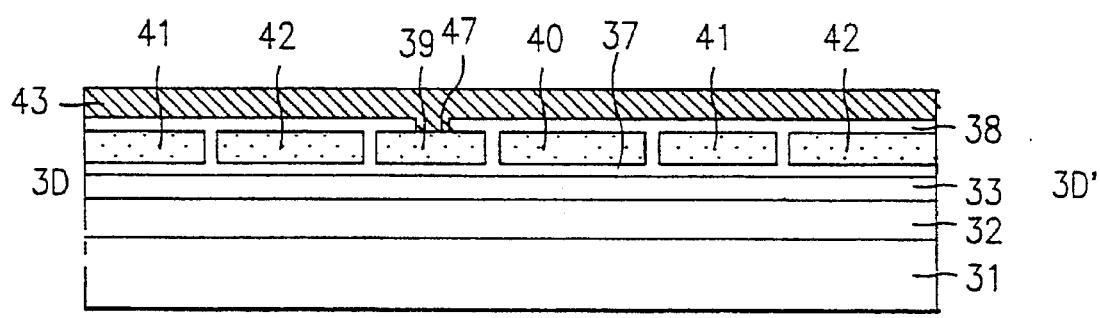
Figure 4E:
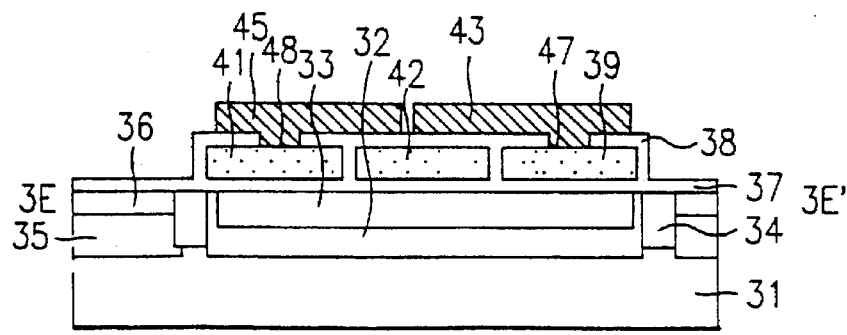

FIGS. 3A and 3B show plane views of a first embodiment solid state image sensor in accordance with this invention, wherein FIG. 3A is a plane view before a light shielding film is formed, and FIG. 3B is a plane view after the light shielding film 49 is formed.

Referring to FIGS. 3A and 3B, the first embodiment solid state image sensor in accordance with this invention, being a four-phase driving type, includes a transmission line 44 or 46 formed for every two adjacent photodiodes 36-1 and 36-2 for applying a second driving clock signal $V\phi 2$ (or a fourth driving clock signal $V\phi 4$) to a second transmission gate 40 (or a fourth transmission gate 42), and two transmission line 43 and 45 formed over the transmission gates in parallel for applying a first, and a third driving clock signals $V\phi 1$ and $V\phi 3$ to a first, and a third transmission gates 39 and 41.

Figure 1:
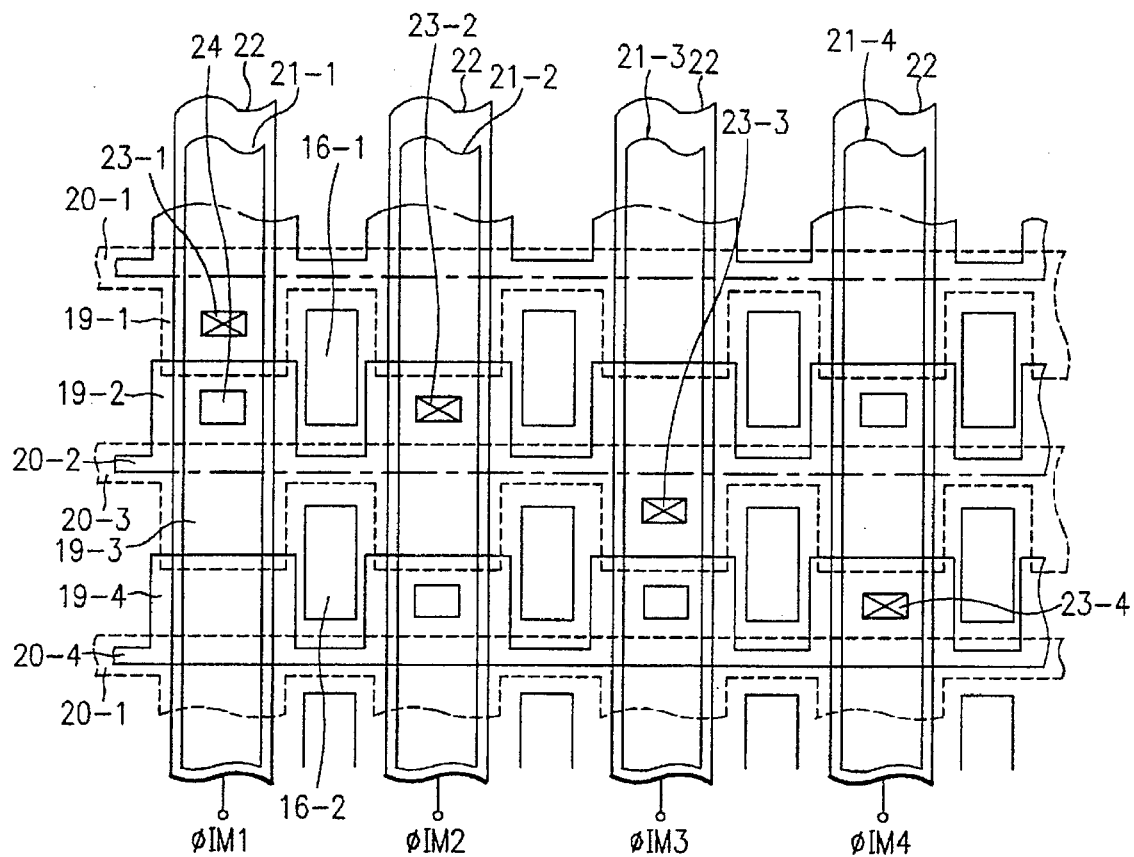
FIG. 1 shows a plane a conventional solid state image sensor.

The the conventional art forms an additional transmission line over transmission gates for reducing resistance after forming two transmission lines in two tiers (e.g., in FIG. 1, a first tier being transmission lines 20-1 and 20-2 for photodiode 16-1, and a second tier being transmission lines 20-3 and 20-4 for photodiode 16-2) for every two photodiodes for applying driving clock signals to respective transmission gates. In contrast, the first embodiment of this invention reduces a width of the transmission line (e.g., 44) between two adjacent photodioded (e.g., 16-1 and 16-2) by forming one transmission line (e.g., 44) for every adjacent two photodiodes and forming two transmission lines e.g., 43 and 45) over the transmission gates.

FIGS. 4A to 4E are sectional illustrations across lines 3A–3A', 3B–3B', 3C–3C', 3D–3D', and 3E–3E', of FIG. 3A, respectively.

A structure of a unit cell of the first embodiment solid state image sensor in accordance with this invention is as follows.

Referring to FIGS. 4A to 4E, the unit cell of the first embodiment solid state image sensor includes a second p–type well 32 formed on a first p type well 31, a BCCD region 33 formed in the second p–type well 32, a first to fourth transmission gates 39-42 formed over the BCCD region repeated as per the order, and two transmission lines 43 and 45 formed at length in parallel thereon. The first transmission gate 39 is electrically connected through the transmission line 43 and a contact 47 provided for applying a first driving clock signal $V\phi 1$, and the third transmission gate 41 is electrically connected through the transmission line 45 and a contact 48 provided for applying a third driving clock signal $V\phi 3$. An insulation film 37 is formed under each of the transmission gates, and the transmission gates and the transmission lines are insulated by an insulation film 38.

With the first embodiment solid state image sensor, optical dead zone caused by the transmission lines can be significantly reduced.

Figure 2:
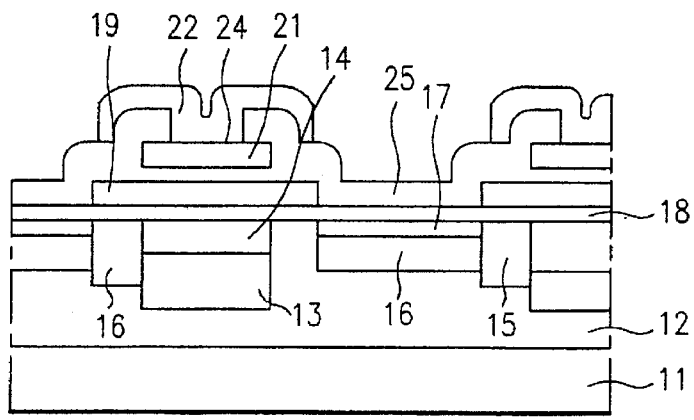
FIG. 2 is a sectional illustration of a unit cell of the solid state image sensor of FIG. 1.

The conventional solid state image sensor has two transmission lines (e.g., in FIGS. 1, 20-3 and 20-4) formed to pass between adjacent photodiodes (e.g., in FIGS. 1, 16-1 and 16-2), causing presence of optical dead zones on upperside and lowerside of each photodiode due to the transmission lines resulting in smaller photosensing regions.

In contrast the first embodiment solid state image sensor of this invention has only one transmission line passing between two adjacent photodiodes, e.g., 16-1 and 16-2 of FIG. 3A, with presence of optical dead zone only on lowerside of each photodiode. Thus, significant reduction of the optical dead zone than the conventional one can be achieved.

As shown in FIG. 3B, the first embodiment solid state image sensor further includes light shielding films 49 formed of a metal on parts excluding the photodiodes regions for receiving light only at the photodiode regions but not at other parts.

Figure 5A:
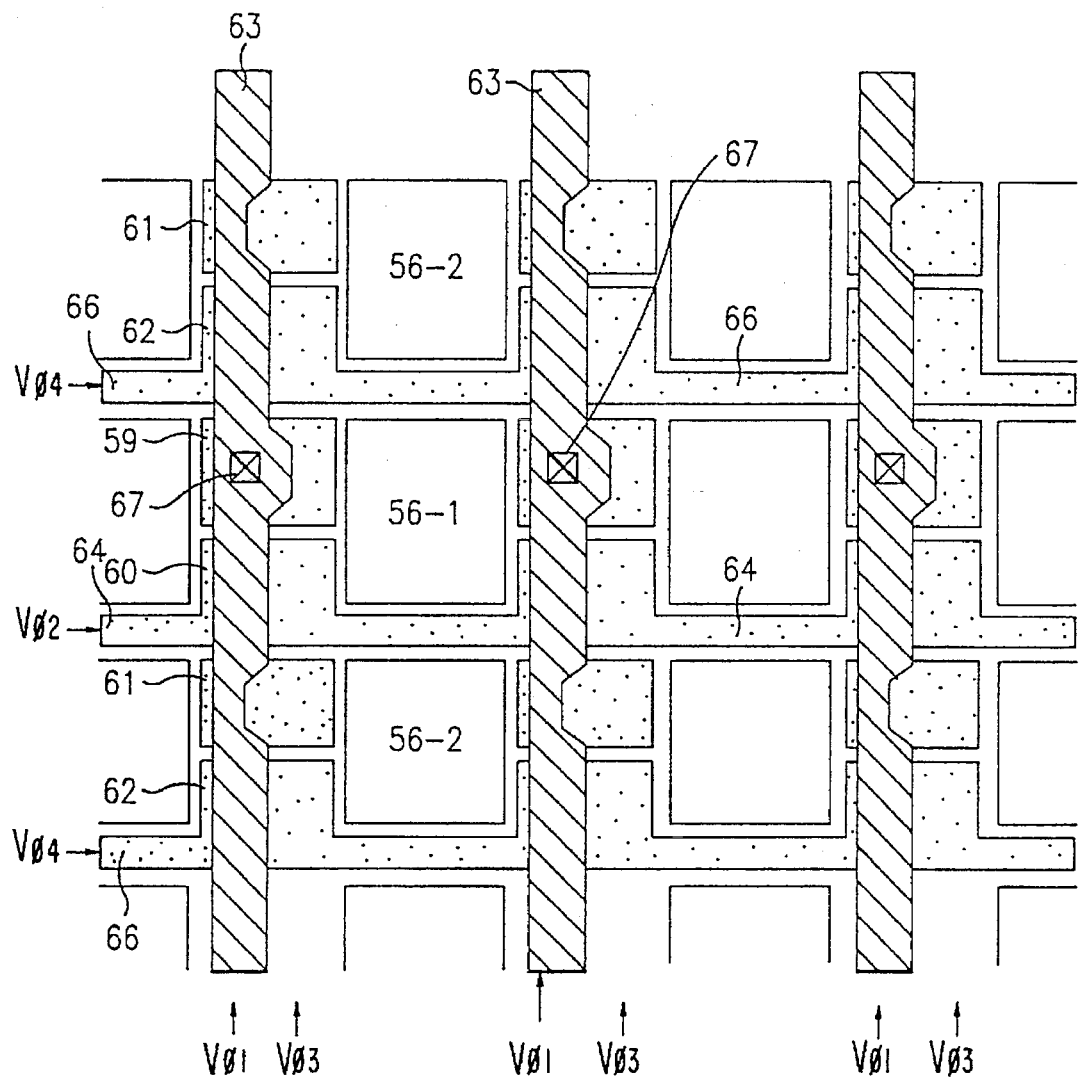
FIG. 5A is a plane view before a light shielding film is formed.
Figure 5B:
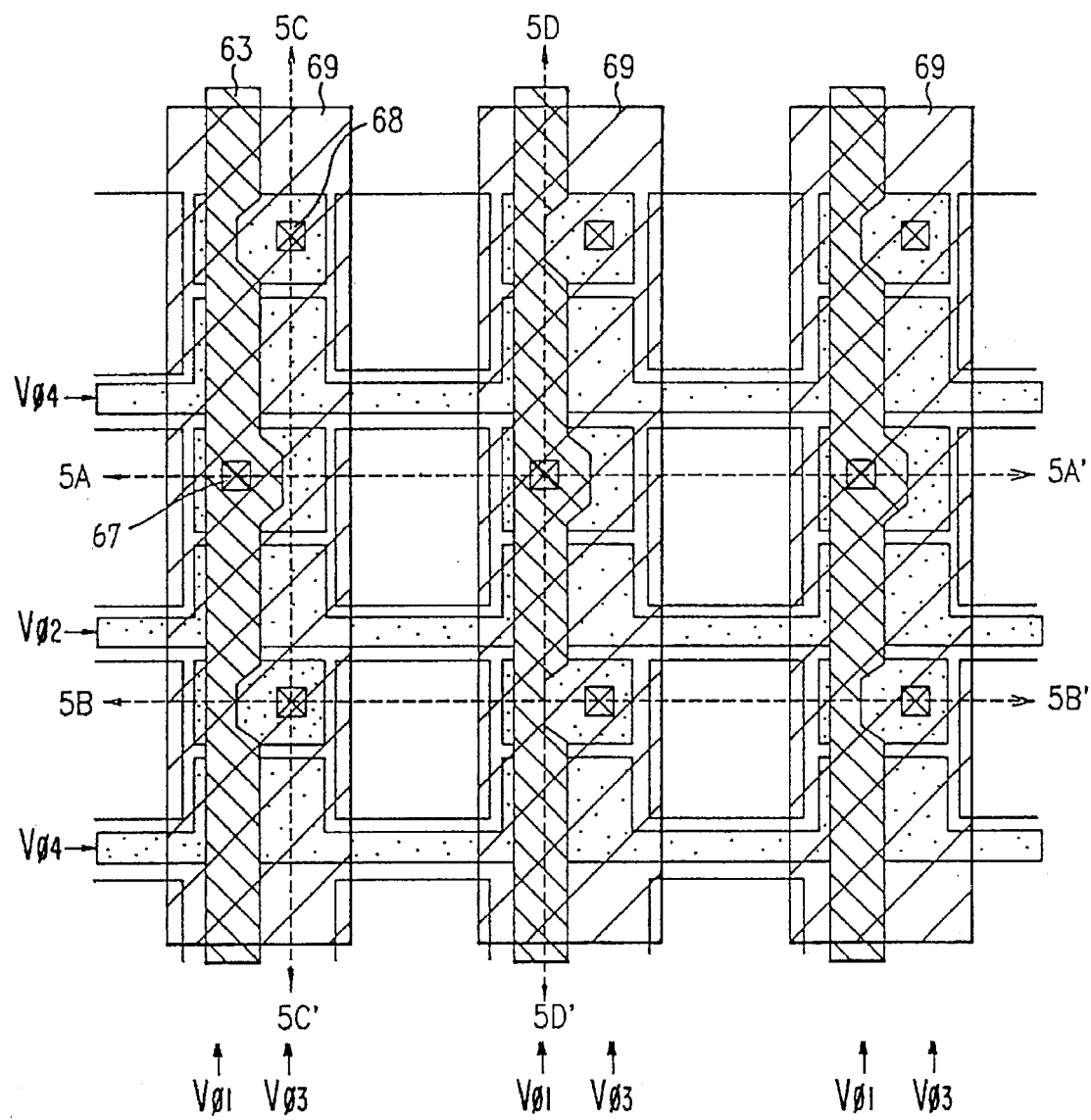
FIG. 5B is a plane view after the light shielding film is formed.
Figure 6A:
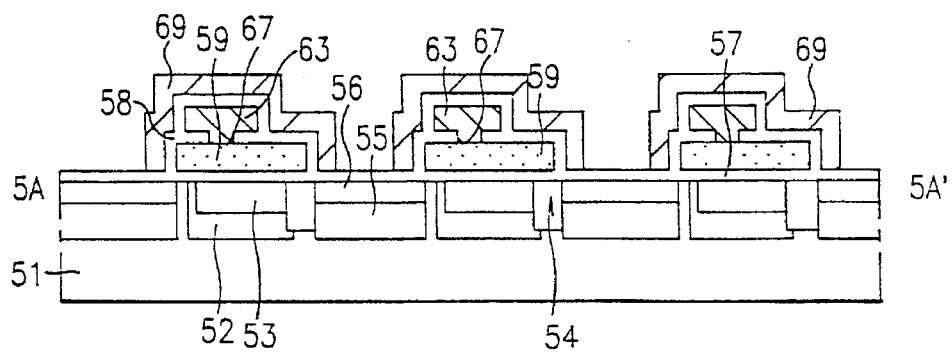
FIGS. 6A to 6D are sectional illustrations across lines 5A–5A', 5B–5B', 5C–5C', and 5D–5D', of FIG. 5B, respectively.
Figure 6B:
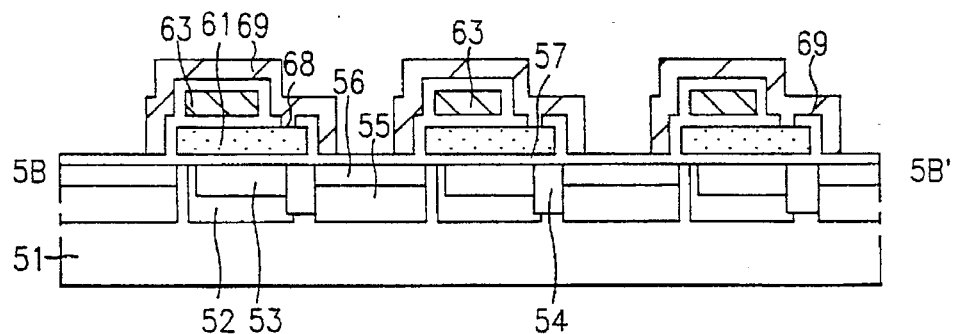
Figure 6C:
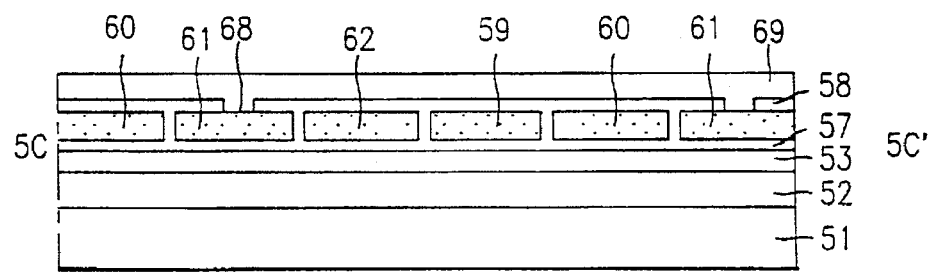
Figure 6D:
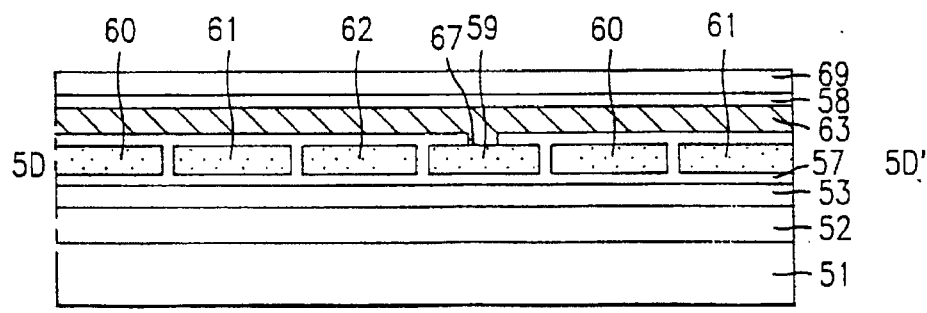

FIGS. 5A and 5B show plane views of a second embodiment solid state image sensor in accordance with this invention, wherein, FIG. 5A is a plane view before a light shielding film is formed, and FIG. 5B is a plane view after the light shielding film is formed.

Referring to FIGS. 5A and 5B, the second embodiment solid state image sensor in accordance with this invention includes a transmission line 64 or 66 formed for every two adjacent photodiodes 56-1 and 56-2 for applying a second driving clock signal $V\phi 2$ (or a fourth driving clock signal $V\phi 4$) to a second transmission gate (or a fourth transmission gate), and one transmission line 63 formed over the transmission gates for applying a first driving clock signals $V\phi 1$ to a first transmission gates. In this time, a second transmission line 64 (or a fourth transmission line 66) between the two photodiodes 56-1 and 56-2 is provided for applying a second driving clock signal $V\phi 2$ (or a fourth driving clock signal $V\phi 4$) to a second transmission gate 60 (or a fourth transmission gate 62), and a transmission line 63 over gates 59-62 is provided for applying a first driving clock signal $V\phi 1$ to a first transmission gate 59.

Unlike the first embodiment, the second embodiment utilizes a metal light shielding film 69, not only as a light shielding film itself, but also as a third transmission line for applying a third driving clock signal $V\phi 3$ to a third transmission gate 61. That is, the second embodiment forms only one transmission line over the transmission gates, and uses the light shielding film as a transmission line, instead.

FIGS. 6A to 6D are sectional illustrations across lines 5A–5A', 5B–5B', 5C–5C', and 5D–5D', of FIG. 5B, respectively.

A structure of a unit cell of the second embodiment solid state image sensor in accordance with this invention is as follows.

Referring to FIGS. 6A to 6D, the unit cell of the second embodiment solid state image sensor includes a second p–type well 52 formed on a first p–type well 51, a BCCD region 53 formed in the second p–type well 52, a first to fourth transmission gates 59–62 formed over the BCCD region repeated as per the order. A transmission line 63 is formed at length on the transmission gates 59-62, and a light shielding film 69 is formed over the transmission gates including the transmission line 63. Accordingly, while the first transmission gate 59 is electrically connected through the transmission line 63 and a contact 67 which is provided for applying a first driving clock signal vø1, the third transmission gate 61 is electrically connected through the light shielding film 69 which acts as a transmission line for applying a third driving clock signal Vø3 and a contact 68. An insulation film 57 is formed under the transmission gates, and the transmission gates, the transmission lines and the light shielding films are insulated from one another by an insulation film 58.

The second embodiment not only reduces optical dead zone due to the transmission lines by forming only one transmission line between adjacent photodiodes, but also simplifies the structure of the sensor by utilizing the light shielding film as transmission lines for transmitting the driving clock signals.

The first, and second embodiment solid state image sensors have transmission lines formed over the transmission gates, of a conduction material having significantly lower resistance for eliminating RC delay of the transmission lines.

Since this invention allows to form the transmission line passing between adjacent photodiodes in a single tier, allowing to form the transmission lines between adjacent photodiodes narrower than the conventional two tiered structure, a substantial increase of the fill factor can be achieved.

With the fill factor increased, this invention has advantages that it can improve not only photic sensitivity, but also photic sensitivity characteristic, a limit of high density solid state image sensor.

And, with the utilization of the light shielding film as a driving clock signal transmission line, this invention has an advantage that structure of the image sensor can be simplified.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A solid state image sensor comprising:
   a substrate;
   photodiodes formed on the substrate, said photodiodes being organized into pairs of photodiodes, the photodiodes of a pair being positioned to define a line parallel to a first direction;
   first to fourth transmission gates arranged in a sequence first, second, third, and fourth along said first direction on one side of a photodiode pair;
   first to fourth transmission lines supplying first to fourth driving clock signals, respectively;
   said second and said fourth transmission lines being arranged parallel to a second direction, said second direction being perpendicular to the first direction, the second transmission lines being connected to the second transmission gates and the fourth transmission lines being connected to the fourth transmission gates, respectively, for applying said second and fourth driving clock signals, respectively;
   a first contact formed at each first transmission gate;
   a second contact formed at each third transmission gate; and
   said first and said third transmission lines being formed parallel to said first direction over the transmission gates, the first transmission lines being connected to the first transmission gates by the first contacts, and the third transmission lines being connected to the third transmission gates by the second contacts, respectively, for applying said first and third clock signals, respectively;
   wherein only one of the second and fourth transmission lines is routed along said second direction through a gap in the first direction between any two photodiodes.

2. The solid state image sensor as claimed in claim 1, further comprising a gate insulation film formed between the substrate and the transmission gates.

3. The solid state image sensor as claimed in claim 1, further comprising an interlayer insulation film for insulation between the transmission gates and the transmission lines.

4. The solid state image sensor as claimed in claim 1, further comprising a light shielding film formed of metal over the first and third transmission lines.

5. A solid state image sensor comprising:
   a substrate;
   photodiodes formed on the substrate, said photodiodes being organized into pairs of photodiodes, the photodiodes of a pair being positioned to define a line parallel to a first direction;
   first to fourth transmission gates arranged in a sequence first, second, third, and fourth along said first direction on one side of a photodiode pair;
   first to fourth transmission lines supplying first to fourth driving clock signals, respectively;
   said second and fourth transmission lines being arranged parallel to a second direction, said second direction being perpendicular to the first direction, the second and fourth transmission lines being connected to the second and fourth transmission gates, respectively, for applying said second and fourth driving clock signals, respectively;
   a first contact formed at each third transmission gate;
   a second contact formed at each fourth transmission gate;
   said first transmission lines formed parallel to the first direction over the transmission gates, the first transmission lines being connected to the first transmission gates by the first contacts, for applying said first driving clock signals; and
   strips of a conduction layer formed parallel to the first direction over the transmission gates to cover the first transmission lines and the transmission gates, respectively, the conduction layer being connected to the third transmission gates by the second contacts to apply said third driving clock signals,
   wherein only one of said second and fourth transmission lines is routed along said second direction through a gap in the first direction between any two photodiodes.

6. The solid state image sensor as claimed in claim 5, further comprising a gate insulation film formed between the substrate and the transmission gates.

7. The solid state image sensor as claimed in claim 5, further comprising an insulation film for insulation between the transmission gates and the transmission lines.

8. The solid state image sensor as claimed in claim 5, wherein each of the strips of conduction layer acts, not only as a third transmission line for transmission of the third driving clock signals, but also as a light shielding film.

9. The solid state image sensor as claimed in claim 8, wherein the conduction layer is formed of a metal.

10. A solid state image sensor comprising:

a two-dimensional array of photodiodes organized into pairs of adjacent photodiodes, the photodiodes in a pair being positioned to define a line parallel with a first dimension of the array;

pluralities of first to fourth transmission lines being connected to pluralities of first to fourth transmission gates, respectively;

said second transmission lines being parallel to a second dimension of the array, the second dimension being perpendicular to the first dimension, each second transmission line being positioned, in the first dimension, between a first photodiode and a second photodiode of a pair;

said second transmission gates being positioned in the second dimension betwixt photodiodes of different pairs, each second transmission gate being connected to a second transmission line;

said fourth transmission lines being parallel to the second dimension, each fourth transmission line being positioned in the first dimension between a photodiode of first pair and a photodiode of a second pair;

said fourth transmission gates being positioned in the second dimension betwixt photodiodes of different pairs, each fourth transmission gate being connected to a fourth transmission line;

said first transmission lines being parallel to the first dimension and lying over the second and fourth transmission lines and said first to fourth transmission gates;

said first transmission gates being positioned in the second dimension betwixt photodiodes of different pairs, each first transmission gate being connected to a first transmission line;

said third transmission lines being parallel to the first dimension and lying over the second and fourth transmission lines and said first to fourth transmission gates;

said third transmission gates being positioned in the second dimension betwixt photodiodes of different pairs, each third transmission gate being connected to a third transmission line; and wherein only one of the second and fourth transmission lines is routed along said second dimension through a gap in the first dimension between any two photodiodes.

11. A solid state image sensor as in claim 10, wherein two pairs of photodiodes are separated in the second dimension by a first transmission line and a third transmission line lying therebetwixt.

12. A solid state image sensor as in claim 11, wherein a first transmission line and a third transmission line, separating two pairs of photodiodes, are located side by side.

13. A solid state image sensor as in claim 11, wherein a first transmission line and a third transmission line, separating two pairs of photodiodes, are arranged such that the third transmission line is formed over the first transmission line.

14. A solid state image sensor as in claim 13, wherein each third transmission line is formed from a light shielding film.

15. A solid state image sensor as in claim 14, wherein the light shielding film is metallic.

16. A solid state image sensor as in claim 10, wherein two pairs of photodiodes are separated in the second dimension by a sequence in the first dimension of transmission gates, as follows: a first transmission gate; a second transmission gate; a third transmission gate; and a fourth transmission gate.

17. A solid state image sensor as in claim 10, further comprising a light shielding film formed over the first and third transmission lines.

18. A solid state image sensor as in claim 17, wherein the light shielding film is metallic.

19. A solid state image sensor as in claim 10, further comprising:

an insulating layer separating the first and third transmission lines from the second and fourth transmission lines and from the first to fourth transmission gates, each first transmission gate being connected to a first transmission line and each third transmission gate being connected to a third transmission line via a contact hole, respectively.

20. A solid state image sensor as in claim 10, wherein the first dimension is vertical and the second dimension is horizontal.

* * * * *